US007900172B2

(12) United States Patent
Niitsuma et al.

(10) Patent No.: US 7,900,172 B2
(45) Date of Patent: Mar. 1, 2011

(54) METHOD AND APPARATUS FOR ANALYZING POWER CONSUMPTION

(75) Inventors: Junichi Niitsuma, Kawasaki (JP); Ryuji Fujita, Kawasaki (JP); Kazuhide Tamaki, Kawasaki (JP); Takayuki Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 455 days.

(21) Appl. No.: 12/058,339

(22) Filed: Mar. 28, 2008

(65) Prior Publication Data
US 2008/0177488 A1 Jul. 24, 2008

Related U.S. Application Data

(63) Continuation of application No. PCT/JP2005/018034, filed on Sep. 29, 2005.

(51) Int. Cl.
G06F 17/50 (2006.01)
(52) U.S. Cl. .......................... 716/106; 716/109; 716/136
(58) Field of Classification Search .................. 716/4, 5; 395/500
See application file for complete search history.

(56) References Cited

U.S. PATENT DOCUMENTS

| 5,625,803 | A  | 4/1997  | McNelly et al.    |
|-----------|----|---------|-------------------|
| 5,692,160 | A  | 11/1997 | Sarin             |
| 6,094,527 | A  | 7/2000  | Tsukamoto et al.  |
| 6,330,703 | B1 | 12/2001 | Saito et al.      |
| 6,557,157 | B1 | 4/2003  | Böthel            |
| 6,625,784 | B1 | 9/2003  | Ohta et al.       |
| 2004/0133867 | A1 | 7/2004 | Kitahara          |

FOREIGN PATENT DOCUMENTS

| JP | 2-136755 A    | 5/1990  |
|----|---------------|---------|
| JP | 02-171861 A   | 7/1990  |
| JP | 05-265605 A   | 10/1993 |
| JP | 10-011482 A   | 1/1998  |
| JP | 10-254936 A   | 9/1998  |
| JP | 2001-059856 A | 3/2001  |
| JP | 2002-092065 A | 3/2002  |
| JP | 2002-288257 A | 10/2002 |
| JP | 2003-242188 A | 8/2003  |
| JP | 2004-062238 A | 2/2004  |
| JP | 2004-133702 A | 4/2004  |
| WO | WO 96/18962 A1 | 6/1996 |

OTHER PUBLICATIONS

Saurav Bhattacharyya, "Area and Power Efficient Pattern Prediction Architecture for Filter Cache Access Prediction in the Instruction Memory Hierarchy", 2005 IEEE VLSI-TSA International Symposium on VLSI Design, Automation and Test, 2005 (VLSI-TSA-DAT)., pp. 345-348.

Masanobu Hashimoto et al., "Glitch no Sakugen o Koryo shita Gate Sunpo Saitekika ni yoru Shohi Denryoku Sakugen Shuho", DA Symposium '98, vol. 98, No. 9, ISSN: 1344-0640, pp. 269-274.

*Primary Examiner* — Sun J Lin
(74) *Attorney, Agent, or Firm* — Arent Fox LLP

(57) ABSTRACT

Disclosed is a power consumption analysis method capable of reducing an analysis time of power consumption. The method is performed on a design circuit having a characteristic signal for specifying an operating mode of a circuit block and the method comprises the steps of: measuring an operating rate of the characteristic signal in each unit analysis interval for analyzing the power consumption; determining, based on measurement results of the operating rate of the characteristic signal, whether to measure the operating rate of the circuit block whose operating mode is specified by the characteristic signal; and measuring the operating rate of the circuit block only when determined to measure the operating rate of the circuit block.

10 Claims, 7 Drawing Sheets

METHOD AND APPARATUS FOR ANALYZING POWER CONSUMPTION

This application is a continuing application, filed under 35 U.S.C. §111(a), of International Application PCT/JP2005/018034, filed Sep. 29, 2005.

BACKGROUND (1) Field of the Invention

The present invention relates to a method and an apparatus for analyzing power consumption. More particularly, the present invention relates to a method and an apparatus for analyzing power consumption of a semiconductor integrated circuit.

(2) Description of the Related Art

In design of a system Large Scale Integrated circuit (LSI), it is necessary to confirm before the manufacture that power consumption of the whole chip is a limit value or less and accordingly, power consumption analysis with high accuracy must be performed. Many apparatuses and methods for calculating the power consumption have been developed.

For example, there is known a method of measuring an operating rate of a combinational circuit or a register (the number of changes of a signal) using a logic simulation and calculating the power consumption from a current equation of a load carrying capacity and a basic circuit. Further, there is known a power consumption analysis method using hardware such as an Field Programmable Gate Array (FPGA).

In addition, various types of emulator devices for performing a logic simulation at a high speed using hardware are commercially available. Examples of the emulator devices include the Palladium system by Cadence Design Systems, the System Explorer system by Aptix Corporation and the Celaro emulator by Mentor Graphics Corporation.

Further, there is known a gated clock technique in which when a circuit block including a combinational circuit and a register does not operate, a clock input to the register within the circuit block is stopped in order to reduce power consumption.

In the above-described conventional power consumption analysis methods, an operating rate (an operating rate per unit time) of all the gate circuits of a chip must be added in order to evaluate the power consumption of the whole chip.

Accordingly, in the conventional power consumption analysis methods, when an analysis object is a large-scale circuit including, for example, tens of millions of gate circuits, the data amount of logic simulation results stored for adding the operating rate becomes enormous. As a result, a longer data collection or processing time is required and it takes a long time to analyze the power consumption.

SUMMARY

According to an aspect of the present invention, there is provided a method for analyzing power consumption of a semiconductor integrated circuit. This method is performed on a design circuit having a characteristic signal for specifying an operating mode of a circuit block and this method comprises the steps of: a first operating rate measurement step of measuring an operating rate of the characteristic signal in each unit analysis interval for analyzing the power consumption; a determination step of determining, based on measurement results of the operating rate of the characteristic signal, whether to measure the operating rate of the circuit block whose operating mode is specified by the characteristic signal; and a second operating rate measurement step of measuring the operating rate of the circuit block only when determined in the determination step to measure the operating rate of the circuit block.

DESCRIPTION OF THE PREFERRED EMBODIMENTS

Figure 1:
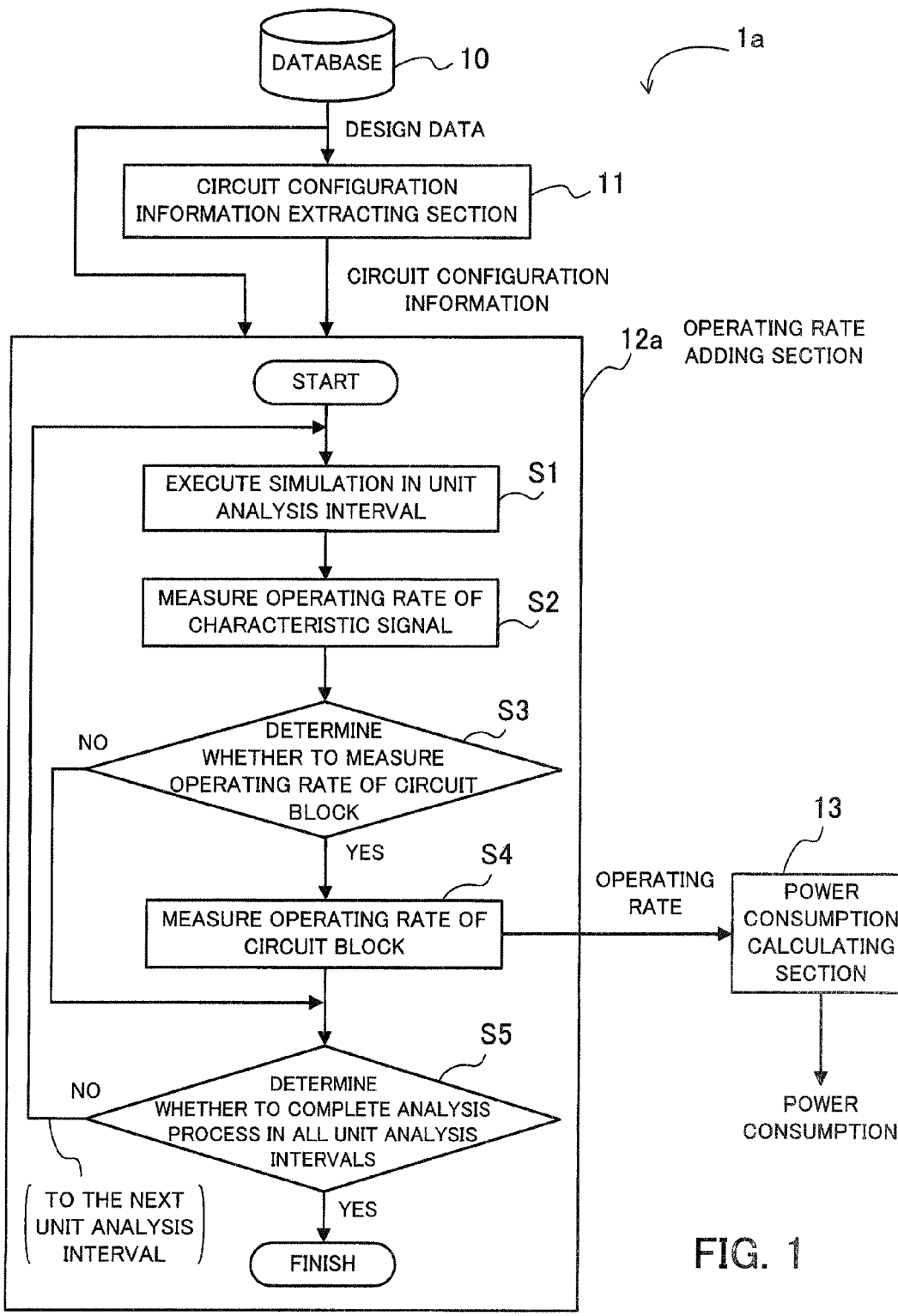
FIG. 1 illustrates a power consumption analysis method according to a first embodiment.

Preferred embodiments of the present invention will be described in detail below with reference to the accompanying drawings, wherein like reference numerals refer to like elements throughout.

FIG. 1 illustrates a power consumption analysis method according to a first embodiment.

The power consumption analysis method according to the first embodiment is carried out by a power consumption analysis apparatus 1a as shown in FIG. 1. The power consumption analysis apparatus 1a comprises, for example, a database 10 that stores design data of a design circuit to be analyzed, a circuit configuration information extracting section 11 that extracts circuit configuration information from the design data, an operating rate adding section 12a that adds the operating rate of a circuit block, and a power consumption calculating section 13 that calculates power consumption based on the added operating frequencies.

The database 10 stores design data of a design circuit whose power consumption is analyzed. The design circuit as an analysis object is a circuit with a characteristic signal for specifying an operating mode. The characteristic signal for specifying the operating mode includes, for example, a signal for using the above-described gated clock.

Figure 2:
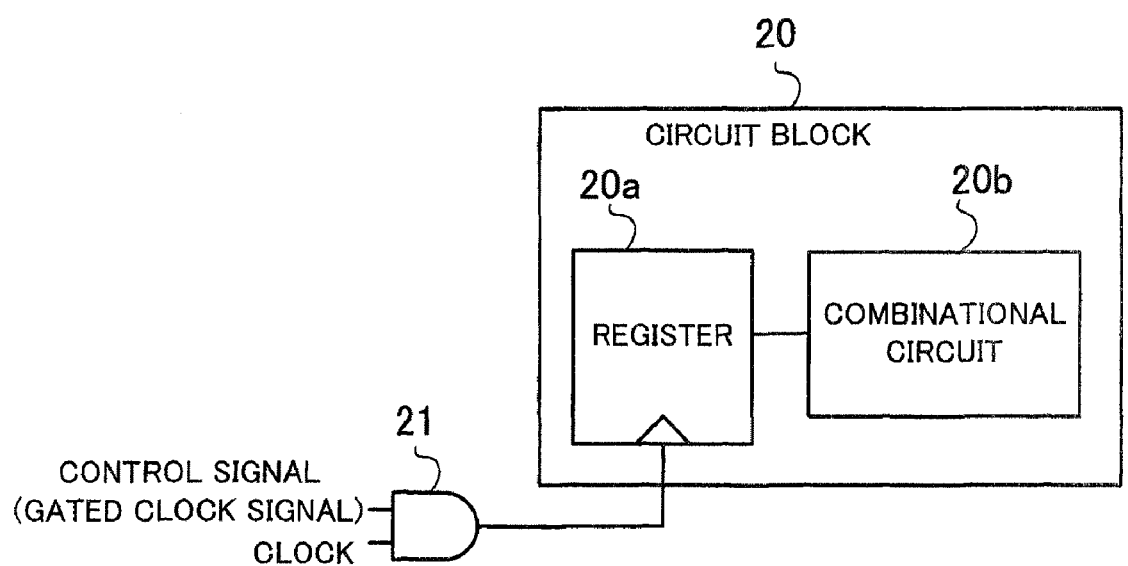
FIG. 2 shows one example of a circuit using a gated clock.

FIG. 2 shows one example of a circuit using a gated clock.

The gated clock is a technique where when a circuit block 20 does not operate, a clock input to a register 20a within the circuit block 20 is stopped to thereby reduce power consumption. Stopping the clock input to the register 20a means that a combinational circuit 20b connected to the register 20a is prevented from operating. The example of FIG. 2 uses a structure in which a control signal (hereinafter, referred to as a gated clock signal) controls a transmission to the register 20a of a clock that is input to one terminal of an AND circuit 21. Here, when the gated clock signal is set at H level, a clock is input to the register 20a whereas when the gated clock signal is set at L level, an input of a clock to the register 20a is stopped.

Returning to FIG. 1, the circuit configuration information extracting section 11 performs extraction of the characteristic signal and extraction of the circuit block whose operating mode is specified by the characteristic signal.

The operating rate adding section 12a has a function of measuring the operating rate of the circuit block by the logic simulation. In the power consumption analysis method according to the first embodiment, the operating rate adding section 12a measures, before measuring the operating rate of the circuit block in each unit analysis interval for analyzing the power consumption, the operating rate of the characteristic signal in the unit analysis interval. Based on the measuring results, the section 12a then determines whether to measure the operating rate of the circuit block whose operating mode is specified by the characteristic signal. Only when determining to perform the measurement, the section 12a measures the operating rate of the circuit block. The operating rate means the number of low-to-high or high-to-low transitions per unit analysis interval of the characteristic signal or of a signal of each gate circuit within the circuit block.

The power consumption calculating section 13 calculates, based on the operating rate of the circuit block in each unit analysis interval for analyzing the power consumption, the power consumption in reference to a load carrying capacity of each gate circuit within the circuit block.

The above-described power consumption analysis apparatus 1a is realized using, for example, a computer. In that case, a Central Processing Unit (CPU) executes a program stored in a storage media, thereby realizing processes executed by the circuit configuration information extracting section 11, the operating rate adding section 12a and the power consumption calculating section 13. The database 10 is, for example, a hard disk. Further, the database 10 may be another computer connected to a computer via a network.

In addition, a part or all of the components other than the database 10 may be integrated into an LSI.

Hereinafter, operations of the above-described power consumption analysis apparatus 1a will be described as well as the power consumption analysis method according to the first embodiment will be described in detail. In what follows, there will be described a case of using as a characteristic signal the gated clock signal as shown in FIG. 2.

When the design data of the design circuit is input from the database 10 to the circuit configuration information extracting section 11, the section 11 performs extraction of a gated clock signal as well as performs grouping of registers where the clock input is controlled by the gated clock signal and grouping of combinational circuits connected to the registers.

Figure 3:
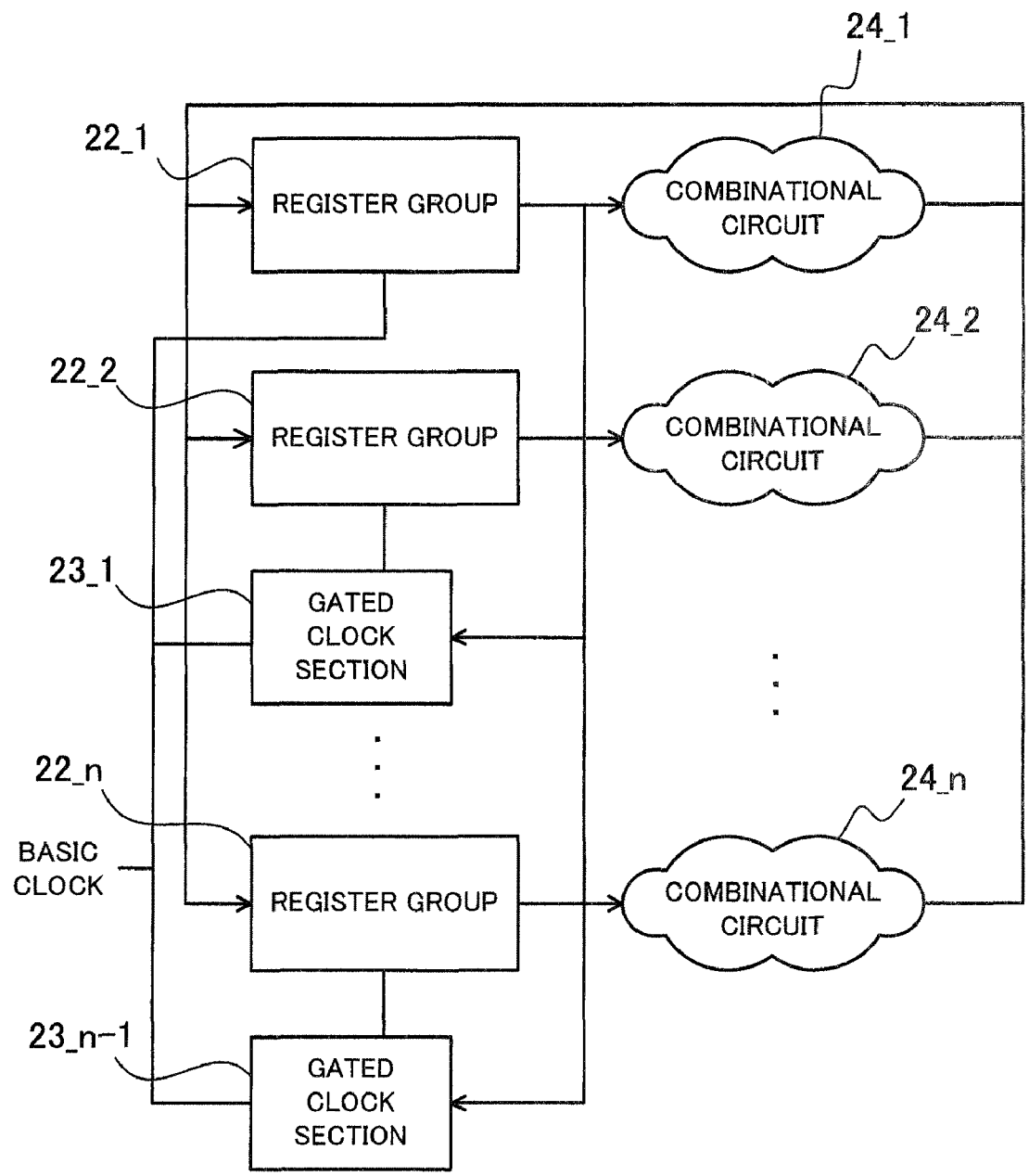
FIG. 3 shows one example of a grouped design circuit.

FIG. 3 shows one example of the grouped design circuit.

For example, registers are grouped into a register group 22_1 to which a basic clock signal is directly input without using the gated clock signal, and register groups 22_2, ..., 22_n where input or input stop of the basic clock signal is determined by different gated clock signals. Gated clock sections 23_1, ..., and 23_n−1 that control the input of the basic clock signal by different gated clock signals are formed, for example, by the above-described AND circuit as shown in FIG. 2. Combinational circuits 24_1, 24_2, ..., 24_n connected to the respective registers 22_1, 22_2, ..., 22_n are also grouped.

The thus grouped circuit configuration information is input to the operating rate adding section 12a together with the design data.

In the power consumption analysis method according to the first embodiment, the operating rate adding section 12a executes the logic simulation in each unit analysis interval for analyzing the power consumption (step S1).

A unit time of the logic simulation is determined by a clock cycle. When a clock cycle is 500 MHz, 2 nanoseconds are used as the unit time. In general, the unit time for analyzing the power consumption during the execution of application largely differs from that of the logic simulation.

For example, for analyzing the power consumption in such a case that a TV picture display process of processing one screen in one thirtieth second is performed, when the specification is made to analyze the power consumption for one screen process with an accuracy of 1/100, one three-thousandth of a second, namely, about 300 microseconds are used as the unit time. In that case, when a clock cycle is 500 MHz, 150,000 clock intervals are used as the unit analysis interval.

From results of the logic simulation in the unit analysis interval, the operating rate adding section 12a measures the operating rate of one gated clock signal (step S2).

Figure 4:
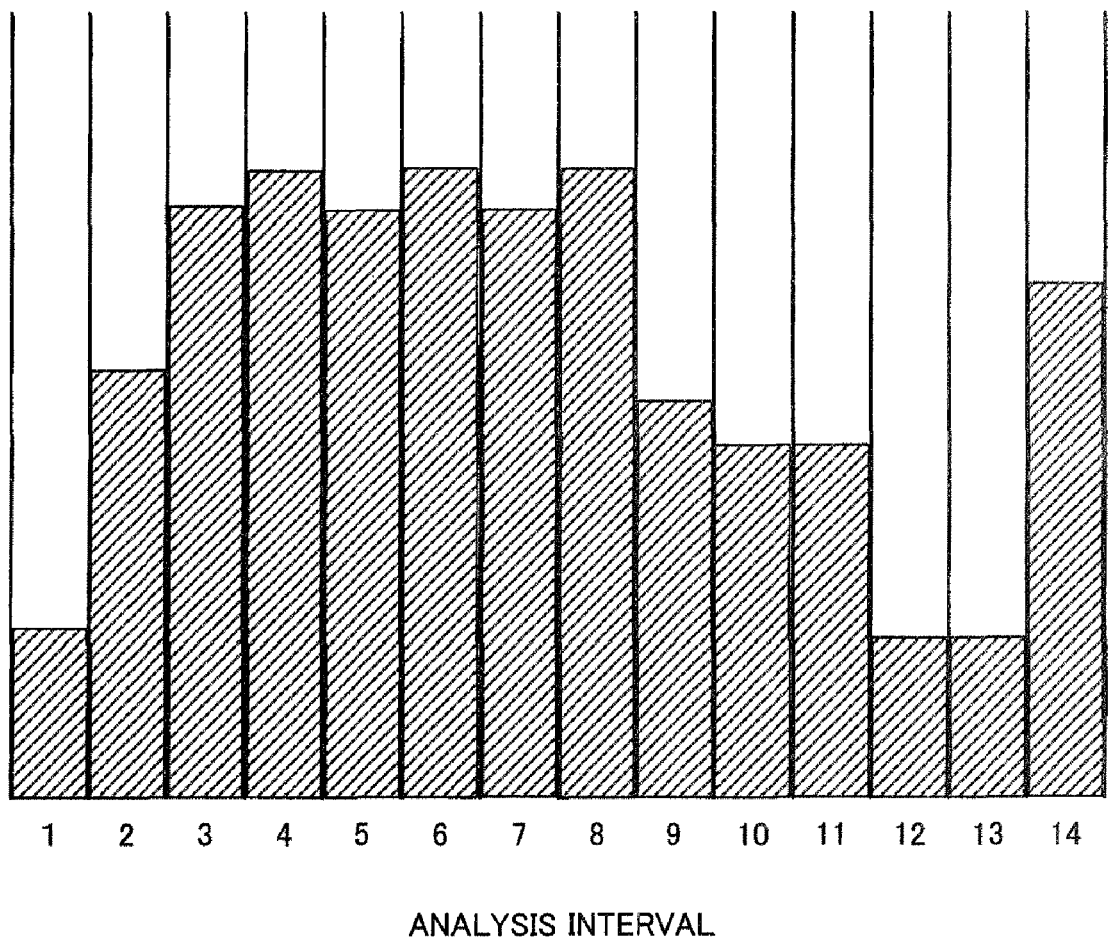
FIG. 4 shows a measurement example of an operating rate of a gated clock signal.

FIG. 4 is a measurement example of the operating rate of the gated clock signal.

By the process of step S2, a measured value of the operating rate of the gated clock signal in each unit analysis interval is obtained.

Thereafter, based on the measurement results of the operating rate of the gated clock signal, the operating rate adding section 12a determines whether to measure the operating rate of the circuit block (the above-described grouped registers and combinational circuits) whose operating mode is specified by the gated clock signal (step S3). Examples of this determination method include the followings.

1. When a difference between the operating rate of the gated clock signal in the previous unit analysis interval and that (operating rate) in this unit analysis interval is a predetermined value or more, the operating rate of the circuit block is measured whereas when the difference is a predetermined value or less, the operating rate of the circuit block is not measured.

2. When the operating rate of the gated clock signal is a certain operating rate or less, the operating rate of the circuit block is not measured. In that case, the operating rate of the circuit block whose operating rate is not measured is set to zero or set to a value obtained by multiplying an operating rate of the gated clock signal by a predetermined coefficient.

3. In the methods of 1 and 2, whether to measure the operating rate of the circuit block in the present unit analysis interval is determined based on information on the operating rate of the gated clock signal in the previous unit analysis interval. The methods of 1 and 2 require both a logic simulation for measuring the operating rate of the gated clock signal and that for measuring the operating rate of the circuit block. In contrast, the method of 3 requires only one logic simulation although the accuracy decreases.

As a result of the determination in step S3, when determined to measure the operating rate of the circuit block, the operating rate adding section 12a measures the operating rate of the circuit block by the logic simulation (step S4).

Figure 5:
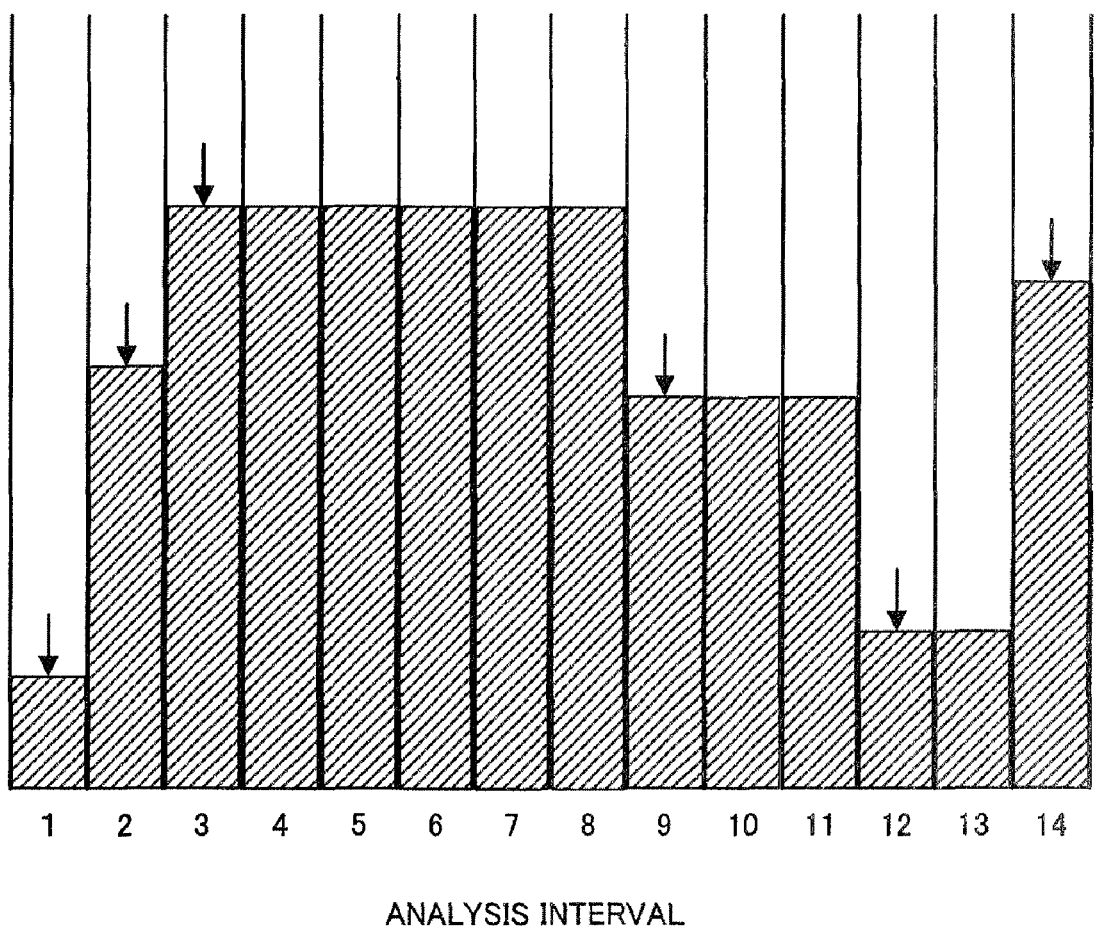
FIG. 5 shows a measurement example of an operating rate of a circuit block.

FIG. 5 shows a measurement example of the operating rate of the circuit block. Here, FIG. 5 shows the measurement example of the circuit block operating rate obtained when using the first method in the determination process of step S3 based on the measurement results of the operating rate of the gated clock signal shown in FIG. 4. An arrow of FIG. 5 indicates the unit analysis interval which requires measuring the operating rate of the circuit block. In FIG. 4, a difference between the operating frequencies of the gated clock signal measured in the unit analysis intervals 1 and 2, and a difference between the operating frequencies measured in the unit analysis intervals 2 and 3 are large. Accordingly, the operating frequencies of the circuit block whose operating mode is specified by the gated clock signal may also differ from each other. Therefore, in the unit analysis intervals 1, 2 and 3, the operating rate of the circuit block is measured by the logic simulation. On the other hand, in FIG. 4, a difference between the operating frequencies of the gated clock signal measured in the unit analysis intervals 3 to 8 is small. Accordingly, in the unit analysis intervals 4 to 8, the operating rate is not measured on the assumption that the operating frequencies of the circuit block in the unit analysis intervals 4 to 8 are almost the same as that in the unit analysis interval 3. By similarly performing the process on the following unit analysis intervals, the number of times of measuring the operating rate of the circuit block can be reduced.

The operating rate of the circuit block measured by the process of step S4 is input to the power consumption calculating section 13 and the power consumption in the present unit analysis interval is calculated.

As shown in FIG. 3, when there are present the circuit blocks (registers 22_2 to 22_n and combinational circuits 24_2 to 24_n) whose operating modes are specified by the plurality of different gated clock sections 23_1 to 23_n−1, the processes of steps S1 to S4 are performed on the respective circuit blocks in the respective unit analysis intervals. As to the circuit block (the register 22_1 and the combinational circuit 24_1) using no gated clock signal, the operating rate is measured as usual in all the unit analysis intervals.

When determined in the determination process of step S3 not to measure the operating rate of the circuit block and/or after performing the process of step S4, the operating rate adding section 12a determines whether to complete the power consumption analysis process on all the unit analysis intervals (step S5). Here, when the power consumption analysis process on all the unit analysis intervals is completed, the analysis process is completed whereas when an unprocessed analysis interval remains, the processes starting from step S1 are repeated in order to perform the processes on the unprocessed unit analysis interval.

As described above, according to the power consumption analysis method of the first embodiment, the number of times of measuring the operating rate of the circuit block, which is required to calculate the power consumption, can be reduced. Therefore, the time required to analyze the power consumption can be reduced. In addition, the data amount of logic simulation results stored for measuring the operating rate can also be reduced.

Next, a power consumption analysis method according to a second embodiment will be described.

Figure 6:
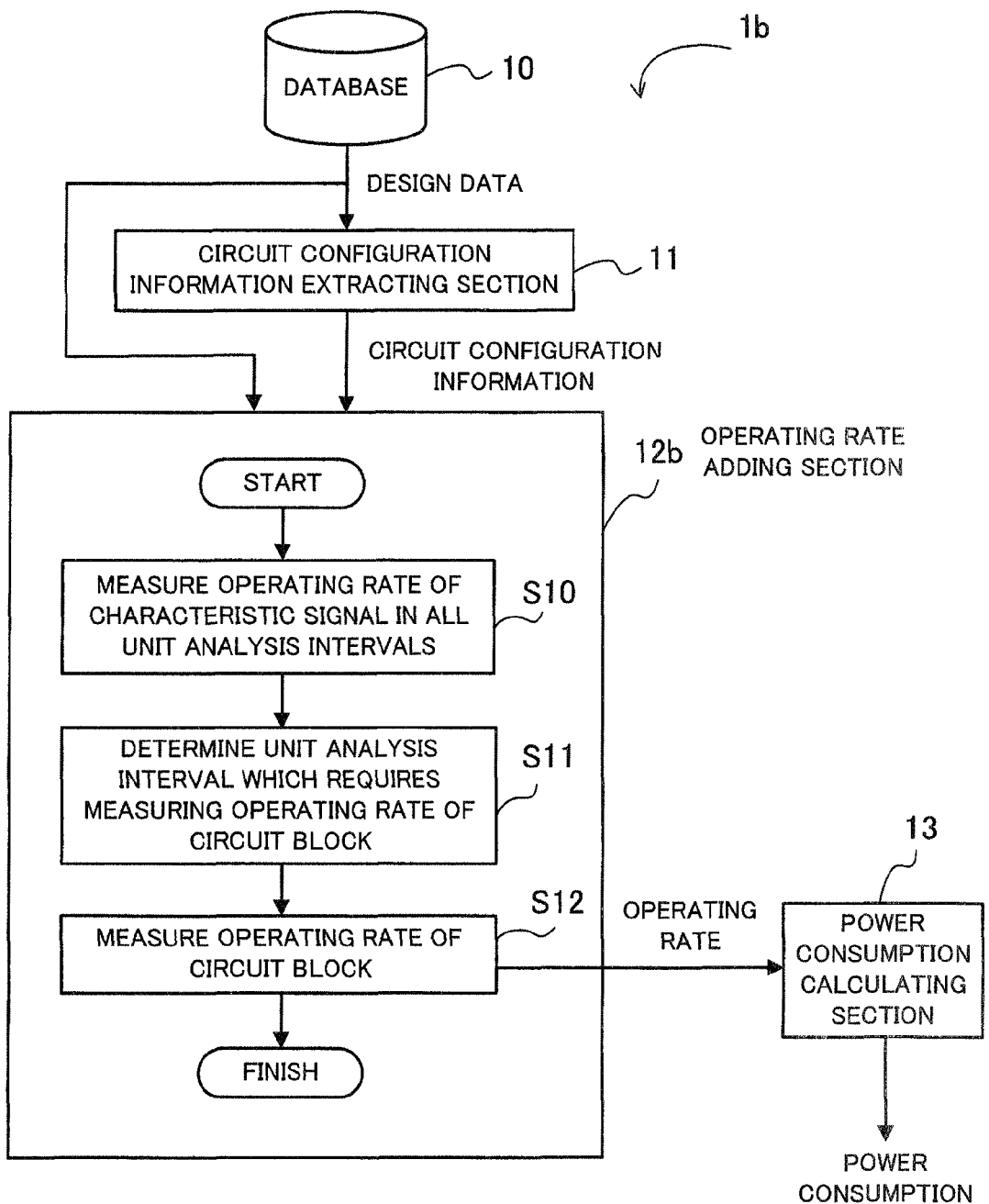
FIG. 6 illustrates a power consumption analysis method according to a second embodiment.

FIG. 6 illustrates a power consumption analysis method according to the second embodiment.

In FIG. 6, the same elements as those in FIG. 1 illustrating the power consumption analysis method according to the first embodiment are indicated by the same reference numerals as in FIG. 1 and the detailed description is omitted.

The power consumption analysis method according to the second embodiment is carried out by a power consumption analysis apparatus 1b as shown in FIG. 6. An operating rate adding section 12b of the power consumption analysis apparatus 1b differs from the operating rate adding section 12a of the power consumption analysis apparatus 1a according to the first embodiment, and performs the following processes.

In the power consumption analysis method according to the second embodiment, the operating rate adding section 12b measures the operating frequencies of characteristic signals (gated clock signals) in all the unit analysis intervals by the logic simulation (step S10). Then, from the measurement results, the 12b determines the unit analysis interval which requires measuring the operating rate of the circuit block (step S11).

In the process of step S11, the above-described determination methods of 1 and 2 can be used. Further, there may be used the determination that the operating rate of the circuit block is not measured in the analysis interval in which the added operating rate of the gated clock signal is a specified ratio (for example, top 80%) or less.

Then, in the analysis interval determined to require the measurement, the operating rate adding section 12b measures the operating rate of the circuit block by the logic simulation (step S12).

According to the above-described power consumption analysis method of the second embodiment, since the operating rate of the gated clock signal in all the unit analysis intervals must be held, the data amount increases. However, the method according to the second embodiment has the benefit that whether to measure the operating rate of the circuit block can be determined in consideration of the entire accuracy in reference to the operating rate of the gated clock signal in all the unit analysis intervals.

In the power consumption analysis method according to the first and second embodiments, it is desirable to use an emulator device in order to speed up the logic simulation for measuring the operating rate of the characteristic signal or measuring the operating rate of the circuit block.

Figure 7:
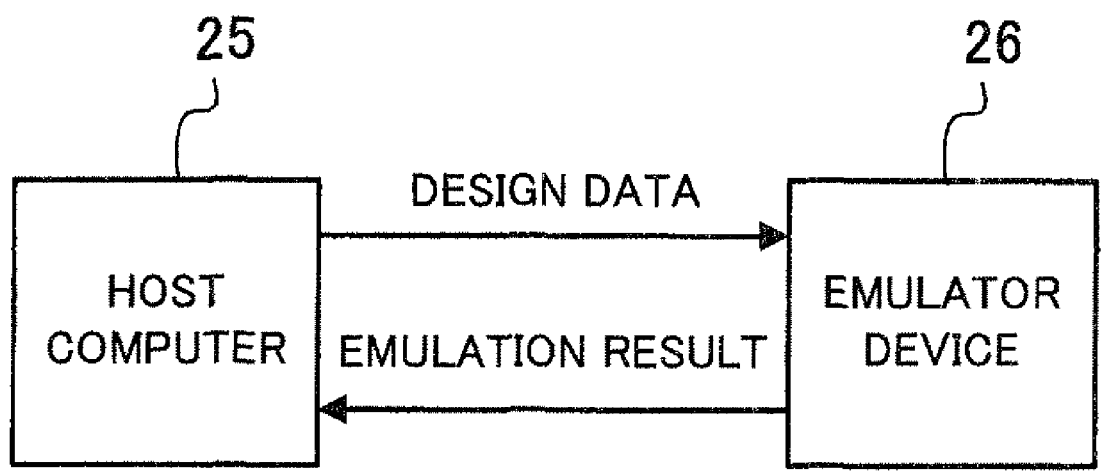
FIG. 7 shows an application example of an emulator device.

FIG. 7 shows an application example of the emulator device.

A host computer 25 that executes the above-described power consumption analysis process transmits design data of the design circuit to the emulator device 26, thereby allowing the device 26 to execute the logic simulation.

A power consumption analysis method using a general emulator device includes a method of adding to the circuit under test an additional circuit for counting the operating rate of a node. However, in this case, since a counting circuit is added at each node, a circuit scale is increased by several dozen times. Further, although the emulator device can output the results of the circuit under test as waveform data, the time required to dump the data becomes enormous.

Therefore, the emulator device 26 according to the present embodiment executes the logic simulation as follows. That is, the device 26 measures the operating rate of the characteristic signal using the counting circuit. When measuring the operating rate of the circuit block, the device 26 transmits the emulation results to the host computer 25 using an output of the waveform data. The host computer 25 measures the operating rate of the circuit block based on the waveform data.

Thus, the operating rate of the characteristic signal to be constantly measured can be measured using a high-speed counting circuit, and the operating rate of the circuit block to be intermittently measured can be measured using a low-speed waveform data output. Therefore, the trade-off between the execution speed and the increase in the circuit scale is optimized.

The above description is made on a case of using the gated clock signal as the characteristic signal; however, the present invention is not limited thereto. An external interface signal such as an enable signal for operating the circuit block, a read request signal or write request signal from the circuit block to an input-output bus, and an access request signal to a memory may be used as the characteristic signal.

The power consumption analysis method of the present invention is performed on a design circuit having a characteristic signal for specifying an operating mode of a circuit block. The method comprises the steps of: measuring an operating rate of the characteristic signal in each unit analysis interval for analyzing the power consumption; determining, based on measurement results of the operating rate of the characteristic signal, whether to measure the operating rate of the circuit block whose operating mode is specified by the characteristic signal; and measuring the operating rate of the circuit block only when determined to measure the operating rate of the circuit block. Therefore, the number of times of measuring the operating rate of the circuit block can be reduced. As a result, an analysis time of power consumption of a semiconductor integrated circuit can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method executed by a computer for analyzing power consumption of a semiconductor integrated circuit, the method being performed on a design circuit having a characteristic signal for specifying an operating mode of a circuit block, wherein the computer comprising a processor, the method comprising:
    measuring an operating rate of the characteristic signal in each of unit analysis intervals for analyzing the power consumption via the processor;
    determining, based on measurement results of the operating rate of the characteristic signal, whether to measure the operating rate of the circuit block whose operating mode is specified by the characteristic signal; and
    measuring the operating rate of the circuit block only when it is determined to measure the operating rate of the circuit block.

2. The method according to claim 1, wherein whether to measure the operating rate of the circuit block is determined based on the measurement results of the operating rate of the characteristic signal in each of the unit analysis intervals.

3. The method according to claim 1, wherein each unit analysis interval which requires measuring the operating rate of the circuit block is determined based on the measurement results of the operating rate of the characteristic signal in all the unit analysis intervals.

4. The method according to claim 1, wherein it is determined that when a difference between the operating rate of the characteristic signal in one unit analysis interval and that in a previous unit analysis interval is a predetermined value or more, the operating rate of the circuit block is measured, whereas when the difference is another predetermined value or less, the operating rate of the circuit block is not measured.

5. The method according to claim 1, wherein it is determined that when an operating rate of the characteristic signal is a certain operating rate or less, the operating rate of the circuit block is not measured.

6. The method according to claim 1, wherein whether to measure the operating rate of the circuit block in one unit analysis interval is determined using information on the operating rate of the characteristic signal in a previous unit analysis interval.

7. The method according to claim 1, wherein the characteristic signal is a gated clock signal.

8. A method for analyzing power consumption of a semiconductor integrated circuit, the method being performed on a design circuit having a characteristic signal for specifying an operating mode of a circuit block, the method comprising:
    measuring an operating rate of the characteristic signal in each of unit analysis intervals for analyzing the power consumption;
    determining, based on measurement results of the operating rate of the characteristic signal, whether to measure the operating rate of the circuit block whose operating mode is specified by the characteristic signal; and
    measuring the operating rate of the circuit block only when it is determined to measure the operating rate of the circuit block,
    wherein a logic simulation for measuring the operating rate of the characteristic signal or measuring the operating rate of the circuit block is performed using an emulator device.

9. The method according to claim 8, wherein the emulator device, when a counting circuit for measuring the operating rate of the characteristic signal is added to the design circuit, measures the operating rate of the characteristic signal using the counting circuit, and outputs waveform data as emulation results when measuring the operating rate of the circuit block.

10. An apparatus for analyzing power consumption of a semiconductor integrated circuit, the apparatus performing an analysis on a design circuit having a characteristic signal for specifying an operating mode of a circuit block, the apparatus comprising:
    an operating rate adding section to measure an operating rate of the characteristic signal in each unit analysis interval for analyzing the power consumption, to determine based on measurement results of the operating rate of the characteristic signal, whether to measure the operating rate of the circuit block whose operating mode is specified by the characteristic signal, and to measure the operating rate of the circuit block only when determining to measure the operating rate of the circuit block.

* * * * *